(12) United States Patent
Yang

(10) Patent No.: US 11,916,139 B2
(45) Date of Patent: Feb. 27, 2024

(54) SEMICONDUCTOR DEVICE

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 318 days.

(21) Appl. No.: 17/185,979

(22) Filed: Feb. 26, 2021

(65) Prior Publication Data

US 2022/0223724 A1  Jul. 14, 2022

(30) Foreign Application Priority Data

Jan. 12, 2021 (CN) .......................... 202110034669.2

(51) Int. Cl.
*H01L 29/778* (2006.01)
*H01L 29/66* (2006.01)

(52) U.S. Cl.
CPC .... *H01L 29/7786* (2013.01); *H01L 29/66462* (2013.01); *H01L 29/7787* (2013.01)

(58) Field of Classification Search
None
See application file for complete search history.

(56) References Cited

U.S. PATENT DOCUMENTS

| 8,680,535 | B2 | 3/2014 | Yao | |
|---|---|---|---|---|
| 2020/0219987 | A1* | 7/2020 | Lee | ..................... H01L 29/4236 |
| 2020/0365718 | A1* | 11/2020 | Lee | ..................... H01L 29/205 |
| 2022/0157977 | A1* | 5/2022 | Lei | ..................... H01L 29/41775 |

\* cited by examiner

*Primary Examiner* — Grant S Withers
(74) *Attorney, Agent, or Firm* — Winston Hsu

(57) ABSTRACT

A semiconductor device includes a substrate, a semiconductor channel layer, a semiconductor barrier layer, and a gate electrode. The semiconductor channel layer is disposed on the substrate, and the semiconductor barrier layer is disposed on the semiconductor channel layer, where the surface of the semiconductor barrier layer includes at least one recess. The gate electrode is disposed on the semiconductor barrier layer and includes a body portion and at least one vertical extension portion overlapping the recess.

14 Claims, 10 Drawing Sheets

SEMICONDUCTOR DEVICE

BACKGROUND OF THE INVENTION

1. Field of the Invention

The invention relates to the field of semiconductor devices, and more particularly to a high electron mobility transistor and a method of manufacturing the same.

2. Description of the Prior Art

In semiconductor technology, group III-V semiconductor compounds may be used to form various integrated circuit (IC) devices, such as high power field-effect transistors (FETs), high frequency transistors, or high electron mobility transistors (HEMTs). A HEMT is a field effect transistor having a two dimensional electron gas (2-DEG) layer close to a junction between two materials with different band gaps (i.e., a heterojunction). The 2-DEG layer is used as the transistor channel instead of a doped region, as is generally the case for metal oxide semiconductor field effect transistors (MOSFETs). Compared with MOSFETs, HEMTs have a number of attractive properties such as high electron mobility and the ability to transmit signals at high frequencies. However, in order to meet the requirements of the industry, there is still a need to improve conventional HEMTs so as to obtain HEMTs with reduced on-resistance ($R_{ON}$) as well as increased transconductance (gm) and breakdown voltage ($V_{BR}$).

SUMMARY OF THE INVENTION

In view of this, it is necessary to provide an improved high electron mobility transistor to meet the requirements of the industry.

According to one embodiment of the present invention, a semiconductor device is disclosed and includes a substrate, a semiconductor channel layer, a semiconductor barrier layer, and a gate electrode. The semiconductor channel layer is disposed on the substrate, and the semiconductor barrier layer is disposed on the semiconductor channel layer, where the surface of the semiconductor barrier layer includes at least one recess. The gate electrode is disposed on the semiconductor barrier layer and includes a body portion and at least one vertical extension portion overlapping the recess.

According to one embodiment of the present invention, a semiconductor device is disclosed and includes a substrate, a semiconductor channel layer, a semiconductor barrier layer, a gate electrode, and an interlayer dielectric layer. The semiconductor channel layer is disposed on the substrate, and the semiconductor barrier layer is disposed on the semiconductor channel layer, where the semiconductor barrier layer includes a first portion and an adjacent second portion, and the thickness of the first portion is greater than that of the second portion. The gate electrode is disposed on the semiconductor barrier layer, wherein the gate electrode comprises a body portion and at least one vertical extension portion overlapping the second portion. The interlayer dielectric layer is disposed between the body portion and the vertical extension portion.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present invention are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
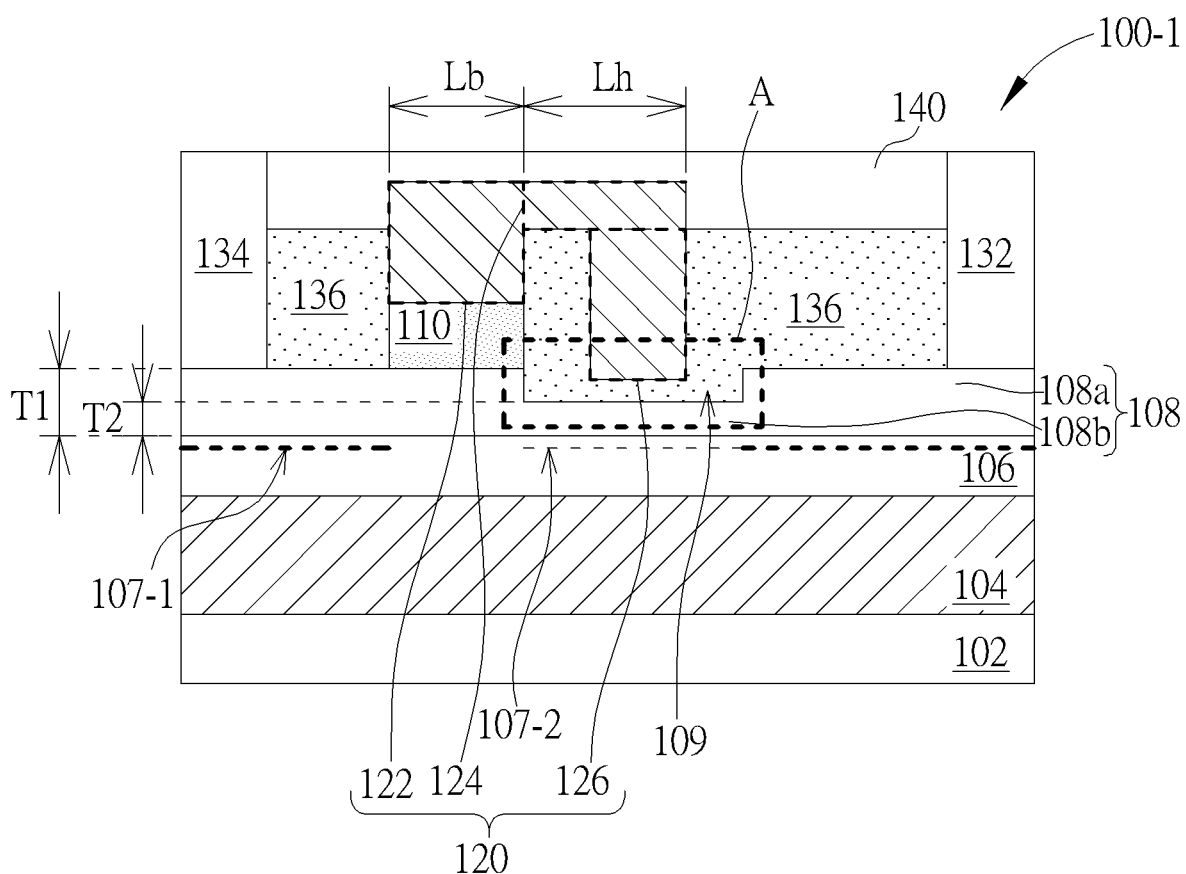
FIG. 1 is a schematic cross-sectional view of a semiconductor device according to one embodiment of the present invention.
Figure 1:
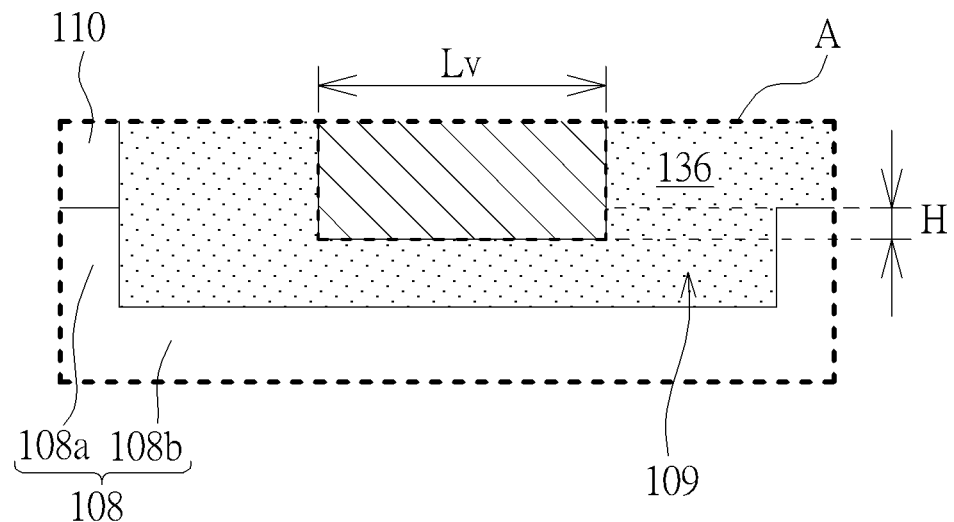

The present disclosure may be understood by reference to the following detailed description, taken in conjunction with the drawings as described below. It is noted that, for purposes of illustrative clarity and being easily understood by the readers, various drawings of this disclosure show a portion of the device, and certain elements in various drawings may not be drawn to scale. In addition, the number and dimension of each device shown in drawings are only illustrative and are not intended to limit the scope of the present disclosure.

Certain terms are used throughout the following description to refer to particular components. One of ordinary skill in the art would understand that electronic equipment manufacturers may use different technical terms to describe the same component. The present disclosure does not intend to distinguish between the components that differ only in name but not function. In the following description and claims, the terms "include", "comprise", and "have" are used in an open-ended fashion and thus should be interpreted as the meaning of "include, but not limited to".

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

When an element or layer is referred to as being "coupled to" or "connected to" another element or layer, it may be directly coupled or connected to the other element or layer, or intervening elements or layers may be presented. In contrast, when an element is referred to as being "directly coupled to" or "directly connected to" another element or layer, there are no intervening elements or layers presented.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means in 10%, 5%, 1%, or 0.5% of a given value or range. Alternatively, the term "about" means in an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that may vary as desired. At the very least, each numerical parameter should at least be construed in light of the number of reported significant digits and by applying ordinary rounding techniques. Ranges may be expressed herein as from one endpoint to another endpoint or between two endpoints. All ranges disclosed herein are inclusive of the endpoints, unless specified otherwise.

It should be noted that the technical features in different embodiments described in the following may be replaced, recombined, or mixed with one another to constitute another embodiment without departing from the spirit of the present invention.

The present invention is directed to a high electron mobility transistor (HEMT) and method for fabricating the same, where HEMTs may be used as power switching transistors for voltage converter applications. Compared to silicon power transistors, group III-V HEMTs feature low on-state resistances and low switching losses due to wide bandgap properties. In the present disclosure, a "group III-V semiconductor" is referred to as a compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), and the like, or a combination thereof. In a similar manner, a "III-nitride semiconductor" is referred to as a compound semiconductor that includes nitrogen and at least one group III element, such as, but not limited to, GaN, aluminum nitride (AlN), indium nitride (InN), AlGaN, InGaN, InAlGaN, and the like, or a combination thereof, but is not limited thereto.

FIG. 1 is a schematic cross-sectional view of a semiconductor device according to one embodiment of the present invention. Referring to FIG. 1, a semiconductor device 100-1 at least includes a substrate 102, a semiconductor channel layer 106, a semiconductor barrier layer 108, and a gate electrode 120, where the semiconductor channel layer 106 is disposed on the substrate 102. The semiconductor barrier layer 108 is disposed on the semiconductor channel layer 106. According to one embodiment of the present invention, the surface of the semiconductor barrier layer 108 may include at least one recess 109. The gate electrode 120 is disposed on the semiconductor barrier layer 108. The gate electrode 120 includes a body portion 122 and at least one vertical extension portion 126, and the vertical extension portion 126 may overlap the recess 109. According to another embodiment of the present invention, the semiconductor barrier layer 108 may include a first portion 108a and a second portion 108b adjoining or abutting each other, the thickness T1 of the first portion 108a may be greater than the thickness T2 of the second portion 108b, and the vertical extension portion 126 of the gate electrode 120 may overlap the second portion 108b of the semiconductor barrier layer 108. Furthermore, according to one embodiment of the present invention, an additional a buffer layer 104 may be disposed between the substrate 102 and the semiconductor channel layer 106, which may be used to reduce the leakage current between the substrate 102 and the semiconductor channel layer 106, or reduce the accumulated stress or lattice mismatch between the substrate 102 and the semiconductor channel layer 106. According to one embodiment of the present invention, the semiconductor device 100-1 may further include a gate capping layer 110, a first interlayer dielectric layer 136, a second interlayer dielectric layer 140, a drain electrode 132, and a source electrode 134. The gate capping layer 110 may be disposed between the semiconductor barrier layer 108 and the body portion 122 of the gate electrode 120. The gate electrode 120, the source electrode 134 and the drain electrode 132 may be disposed in the first interlayer dielectric layer 136, and the source electrode 134 and the drain electrode 132 may be disposed at both sides of the gate electrode 120, respectively. According to one embodiment of the present invention, 2-dimensional electron gas (2-DEG) region 107-1 and 107-2 may be generated at the junction of semiconductor channel layer 106 and semiconductor barrier layer 108, and the carrier concentration of 2-DEG region 107-1 is higher than that of 2-DEG region 107-2. By providing the gate capping layer 110, 2-DEG region 107-1 and 107-2 may not be generated in the corresponding semiconductor channel layer 106 below it, so that part of the two-dimensional electron gas could be cut off.

According to one embodiment of the present invention, the substrate 102 may be a bulk silicon substrate, a silicon carbide (SiC) substrate, a sapphire substrate, a silicon on insulator (SOI) substrate or a germanium on insulator (GOI) substrate, but is not limited thereto, and the stacked layers on the substrate 102 may be formed by any suitable processes, such as molecular-beam epitaxy (MBE), metal organic chemical vapor deposition (MOCVD), hydride vapor phase epitaxy (HVPE), atomic layer deposition (ALD), or other suitable methods to form the buffer layer 104, the semiconductor channel layer 106, the semiconductor barrier layer 108, and the gate capping layer 110 disposed on the substrate 102.

The buffer layer 104 may include a plurality of sub-semiconductor layers (i.e., multiple layers) and the overall resistance of the buffer layer 104 may be higher than the resistance of other layers on the substrate 102. Specifically, the ratio of some elements, such as metal element, of the buffer layer 104 may be changed gradually along a direction from the substrate 102 to the semiconductor channel layer 106. For example, for a case where the substrate 102 and the semiconductor channel layer 106 are a silicon substrate and a GaN layer, respectively, the buffer layer 104 may be graded aluminum gallium nitride ($Al_xGa_{(1-x)}N$) where there is a continuous or stepwise decrease in the x ratio from 0.9 to 0.15 along the direction from the substrate 102 to the semiconductor channel layer 106. In another case, the buffer layer 104 may have a superlattice structure.

The semiconductor channel layer 106 may include one or more layers of group III-V semiconductor composed of GaN, AlGaN, InGaN, or InAlGaN, but not limited thereto. In addition, the semiconductor channel layer 106 may also be one or more layers of doped group III-V semiconductor, such as p-type III-V semiconductor. The dopants of the p-type group III-V semiconductor may be C, Fe, Mg or Zn, but not limited thereto.

The semiconductor barrier layer 108 may include one or more layers of group III-V semiconductor with the composition different from that of the group III-V semiconductor of the semiconductor channel layer 106. For example, the semiconductor barrier layer 108 may include AlN, $Al_yGa_{(1-y)}N$ (0<y<1), or a combination thereof. In accordance with one embodiment, the semiconductor channel layer 106 may be an undoped GaN layer, and the semiconductor barrier layer 108 may be an inherent n-type AlGaN layer. Since there is a bandgap discontinuity between the semiconductor channel layer 106 and the semiconductor barrier layer 108, by stacking the semiconductor channel layer 106 and the semiconductor barrier layer 108 on each other (and vice versa), a thin layer with high electron mobility, also called a two-dimensional electron gas region 107-1, 107-2, may be accumulated near the heterojunction between the semiconductor channel layer 106 and the semiconductor barrier layer 108 due to the piezoelectric effect. In addition, because the thickness T1 of the first portion 108a of the semiconductor barrier layer 108 is larger than the thickness T2 of the second portion 108b, unequal piezoelectric effect may be generated and thus the carrier concentration of the 2-DEG region 107-1 under the first portion 108a is higher than that of the 2-DEG region 107-2 under the second portion 108b. For example, the thickness T1 may range from 6 nm to 30 nm, and the thickness T2 may range from 3 nm to 15 nm, but is not limited thereto. In addition, when the thickness T2 of the second portion 108b is greater than zero, the bottom surface of the recess 109 may be separated from the underlying semiconductor channel layer 106, so that the semiconductor channel layer 106 may not be exposed from the bottom surface of the recess 109. In addition, the recess 109 may be disposed between the body portion 122 of the gate electrode 120 and the drain electrode 132.

The gate capping layer 110 may be adjacent to the recess 109, which may include one or more layers of doped group III-V semiconductor with the composition different from that of the group III-V semiconductor of the semiconductor barrier layer 108, such as p-type III-V semiconductor. The dopants of the p-type group III-V semiconductor may be C, Fe, Mg or Zn, but not limited thereto. According to one embodiment of the present invention, the gate capping layer 110 may be a p-type GaN layer. For example, the thickness of the gate capping layer 110 may be greater than the thickness T1 of the first portion 108a of the semiconductor barrier layer 108, and the thickness of the gate capping layer 110 may be, for example, 30 nm to 100 nm, but is not limited thereto.

According to one embodiment of the present invention, the body portion 122 of the gate electrode 120 may be disposed on the first portion 108a of the semiconductor barrier layer 108, and the vertical extension portion 126 of the gate electrode 120 may be disposed on the second portion 108b of the semiconductor barrier layer 108. Therefore, the vertical extension portion 126 of the gate electrode 120 may be regarded as being disposed corresponding to the recess 109. In addition, the gate electrode 120 may further include a horizontal extension portion 124, which may be used to electrically couple the body portion 122 to the vertical extension portion 126.

Specifically, the body portion 122 may be electrically coupled to the gate capping layer 110 without overlapping the recess 109. The lower portion of the body portion 122 may be disposed in the first interlayer dielectric layer 136, and the upper portion of the body portion 122 may be disposed in the second interlayer dielectric layer 140. The length Lb of the body portion 122 may be 0.5 μm to 4 μm, but is not limited thereto. The horizontal extension portion 124 may be disposed at one side of the body portion 122, extending toward the drain electrode 132, and disposed along the surface of the first interlayer dielectric layer 136. The length Lh of the horizontal extension portion 124 may be larger than the length Lb of the body portion 122, for example, 1 μm to 5 μm, but is not limited thereto. The vertical extension portion 126 may be disposed on the bottom surface of the horizontal extension portion 124 and extend toward the recess 109, so that the bottom surface of the vertical extension portion 126 may be lower than the bottom surface of the horizontal extension portion 124. In addition, the vertical extension portion 126 may be disposed in the first interlayer dielectric layer 136.

Referring to an enlarged schematic diagram of region A in FIG. 1, the length Lv of the bottom surface of the vertical extension portion 126 may be less than the length Lh of the horizontal extension portion 124, for example, 0.1 μm to 4

μm, but not limited thereto. In addition, the bottom surface of the vertical extension portion 126 may be disposed corresponding to the position of the recess 109, so that the bottom surface of the vertical extension portion 126 completely overlaps the bottom surface of the recess 109. In other words, the semiconductor barrier layer 108 disposed below the vertical extension portion 126 is a thinner semiconductor barrier layer 108, i.e., the second portion 108b of the semiconductor barrier layer 108. The bottom surface of the vertical extension portion 126 may be at different depth, for example, at a depth lower than the bottom surface of the body portion 122 of the gate electrode 120 or further lower than the bottom surface of the gate capping layer 110, so that the bottom surface of the vertical extension portion 126 may be located in the recess 109 with an overlapping height H. Overlapping height H is smaller than thickness T1 of first portion 108a of semiconductor barrier layer 108. According to one embodiment of the present invention, a first interlayer dielectric layer 136 may be disposed between the bottom surface of the vertical extension portion 126 and the bottom surface of the recess 109 (or between the bottom surface of the vertical extension portion 126 and the second portion 108b of the semiconductor barrier layer 108), so that the vertical extension portion 126 does not directly contact the bottom surface of the recess 109.

Still referring to FIG. 1, the first interlayer dielectric layer 136 of the semiconductor device 100-1 may be disposed on the semiconductor barrier layer 108 and fill up the recess 109. In addition, the first interlayer dielectric layer 136 may surround the body portion 122 and the vertical extension portion 126 of the gate electrode 120, and be disposed between the body portion 122 and the vertical extension portion 126. According to one embodiment of the present invention, a plurality of contact holes may be provided in the first interlayer dielectric layer 136 for accommodating the body portion 122 and the vertical extension portion 126 of the gate electrode 120, the drain electrode 132, and the source electrode 134, respectively. According to one embodiment of the present invention, the first interlayer dielectric layer 136 may be used as a passivation layer to reduce defects existing on the surface of the semiconductor barrier layer 108 and to increase the carrier concentration of the 2-DEG region 107-1 and 107-2.

An optional second interlayer dielectric layer 140 may be disposed on the first interlayer dielectric layer 136 such that the upper portion of the body portion 122 and the horizontal extension portion 124 are buried in the second interlayer dielectric layer 140.

According to one embodiment, the source electrode 134 and the drain electrode 132 are electrically coupled to the semiconductor barrier layer 108 and the semiconductor channel layer 106. According to one embodiment of the present invention, when operating the semiconductor device 100-1, the source electrode 134 may be electrically coupled to an external voltage with a relatively low voltage (e.g., 0V), while the drain electrode 132 may be electrically coupled to an external voltage with a relatively high voltage (e.g., 10V-200 V), but not limited thereto. By applying appropriate bias to the source electrode 134 and the drain electrode 132, respectively, current may flow into or out of the semiconductor device 100-1. In addition, by applying an appropriate bias to the gate electrode 120, the conductivity of the channel region below the body portion 122 and below the vertical extension portion 126 may be adjusted, so that current may flow between the source electrode 134 and the drain electrode 132. The gate electrode 120, the source electrode 134, and the drain electrode 132 may be a single-layer or multi-layer structure, and the compositions of which may include low-resistance semiconductors, metals, or alloys such as Al, Cu, W, Au, Pt, Ti, and polysilicon, but are not limited thereto. In addition, the source electrode 134 and the drain electrode 132 may form ohmic contact with the underlying semiconductor channel layer 106.

Figure 2:
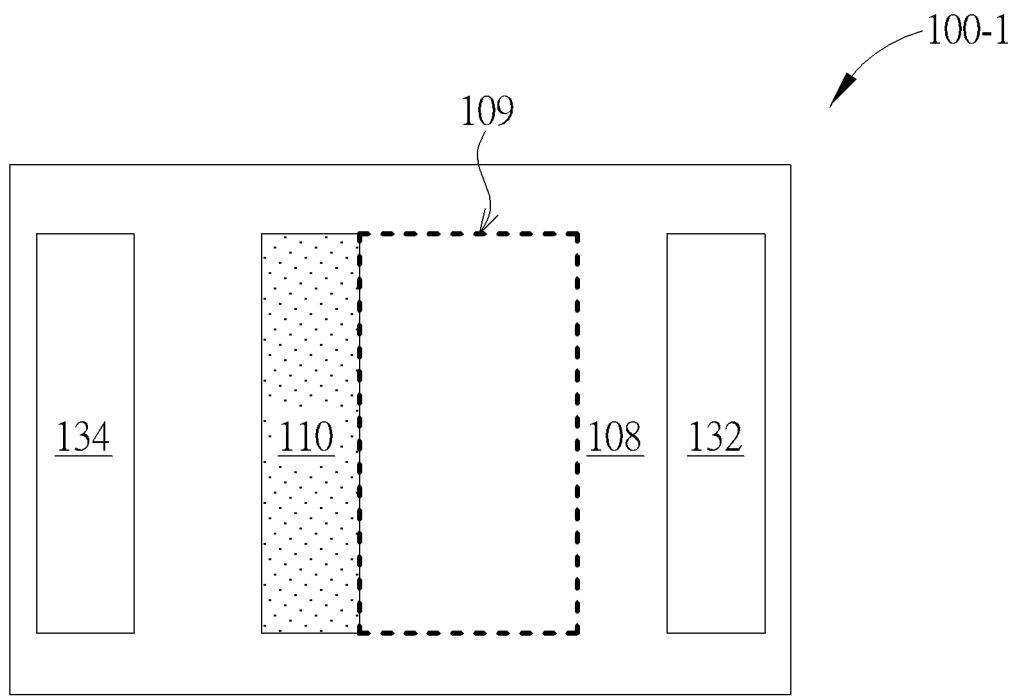
FIG. 2 is a schematic top view of a semiconductor device according to one embodiment of the present invention.
Figure 3:
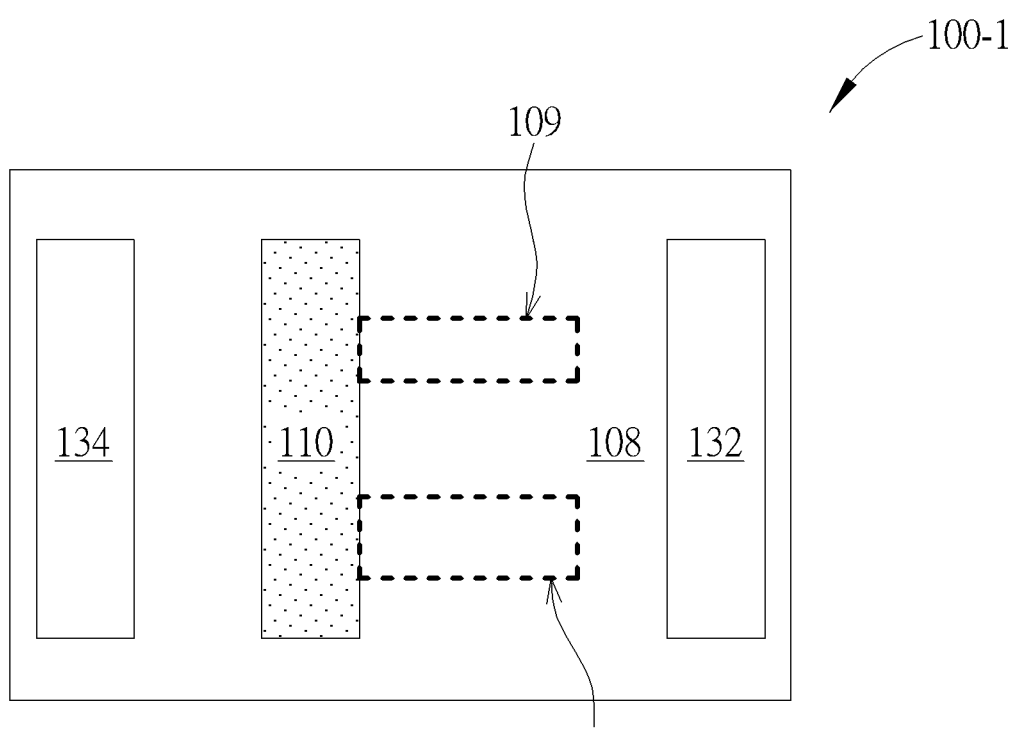
FIG. 3 is a schematic top view of a semiconductor device according to one embodiment of the present invention.

FIG. 2 and FIG. 3 are schematic top views of a semiconductor device according to one embodiment of the present invention. Referring to FIG. 2, the recess 109 in the semiconductor device 100-1 may be disposed at one side of the gate capping layer 110 and the contour of the recess 109 may be a rectangle. The long axis of the recess 109 may be parallel to the long axis of the gate capping layer 110, but is not limited thereto. Referring to FIG. 3, a plurality of recesses 109, such as at least two recesses 109 with different widths, may be disposed at one side of the gate capping layer 110, and the long axis of each recess 109 may not be parallel (e.g., orthogonal) to the long axis of the gate capping layer 110. For a semiconductor device with a plurality of recesses 109, vertical extension portions may be correspondingly disposed over recesses 109, respectively, so that the bottom surface of each vertical extension may overlap each recess 109. According to one embodiment of the present invention, the recess 109 is not limited to a rectangle, but may have other geometric shapes. For example, in a case where the gate capping layer 110 is arc-shaped or ring-shaped when viewed from a top-down perspective, the top-down profile of the recess 109 disposed along the side of the gate capping layer 110 may be arc-shaped or ring-shaped when viewed from a top-down perspective, but is not limited to this.

In addition to the above embodiments, the present invention may further include other modifications about semiconductor devices. For the sake of simplicity, the description below is mainly focused on differences among these embodiments. In addition, the present invention may repeat reference numerals and/or letters in the various modifications and variations. This repetition is for the purpose of simplicity and clarity and does not in itself dictate a relationship between the various embodiments and/or configurations discussed.

Figure 4:
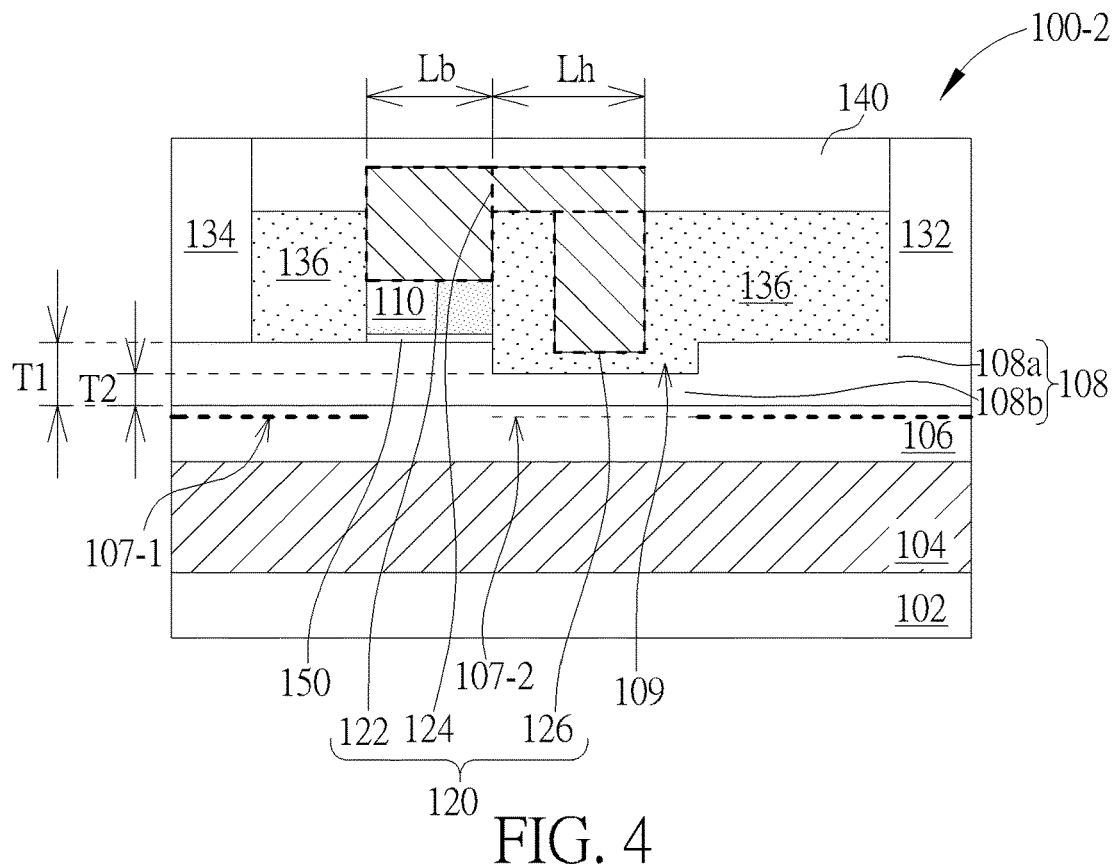
FIG. 4 is a schematic cross-sectional view of a semiconductor device with a gate dielectric layer according to a variant embodiment of the present invention.

FIG. 4 is a schematic cross-sectional view of a semiconductor device with a gate dielectric layer according to a variant embodiment of the present invention. As shown in FIG. 4, the structure of the semiconductor device 100-2 is similar to that of the semiconductor device 100-1 shown in the embodiment of FIG. 1, the main difference is that the semiconductor device 100-2 further includes a gate dielectric layer 150 disposed below the body portion 122 of the gate electrode 120. According to one embodiment of the present invention, the gate dielectric layer 150 may be disposed between the gate capping layer 110 and the semiconductor barrier layer 108, and its composition may be, for example, aluminum nitride. According to another embodiment of the present invention, the gate dielectric layer 150 may be disposed between the body portion 122 of the gate electrode 120 and the gate capping layer 110, and its composition may be, for example, oxide or nitride.

Figure 5:
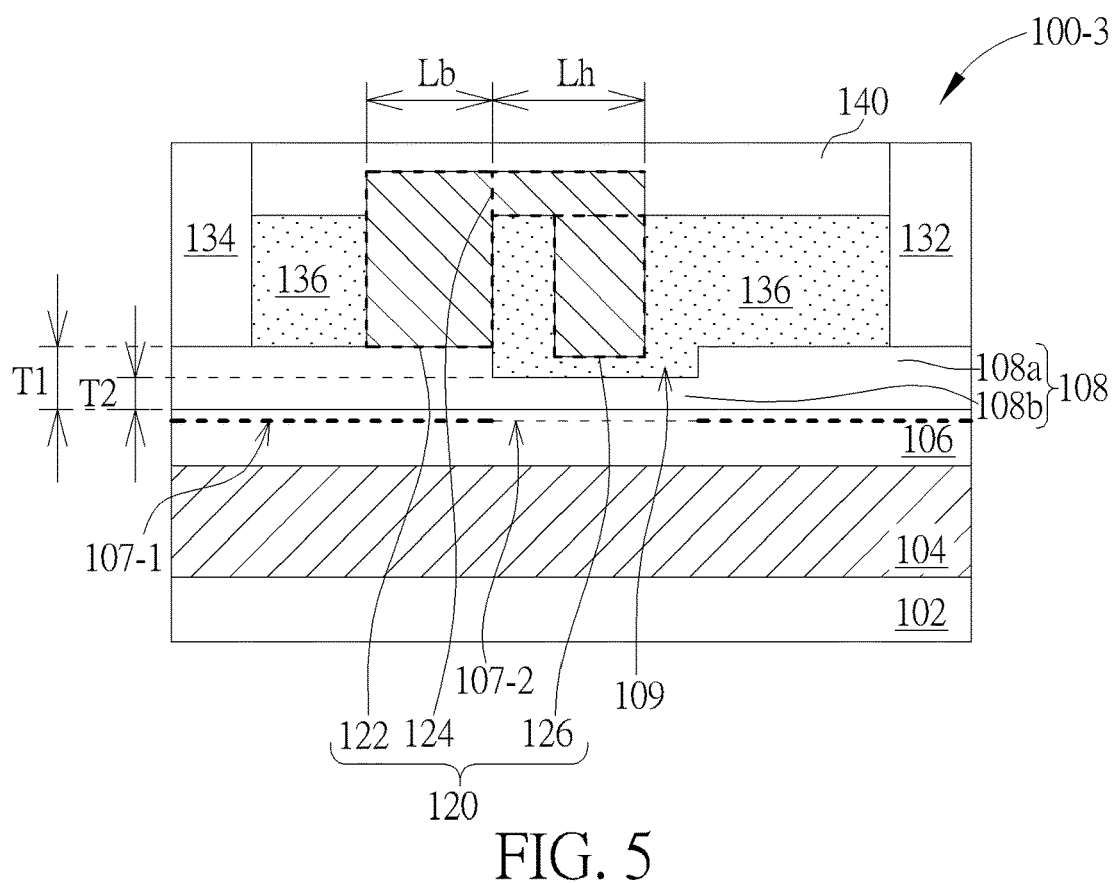
FIG. 5 is a schematic cross-sectional view of a semiconductor device according to a variant embodiment of the present invention.

FIG. 5 is a schematic cross-sectional view of a semiconductor device according to a variant embodiment of the present invention. As shown in FIG. 5, the structure of the semiconductor device 100-3 is similar to that of the semiconductor device 100-1 shown in the embodiment of FIG. 1, the main difference is that no gate capping layer is provided between the body portion 122 of the gate electrode 120 of the semiconductor device 100-3 and the semiconductor barrier layer 108, so the body portion 122 may directly contact the semiconductor barrier layer 108.

Figure 6:
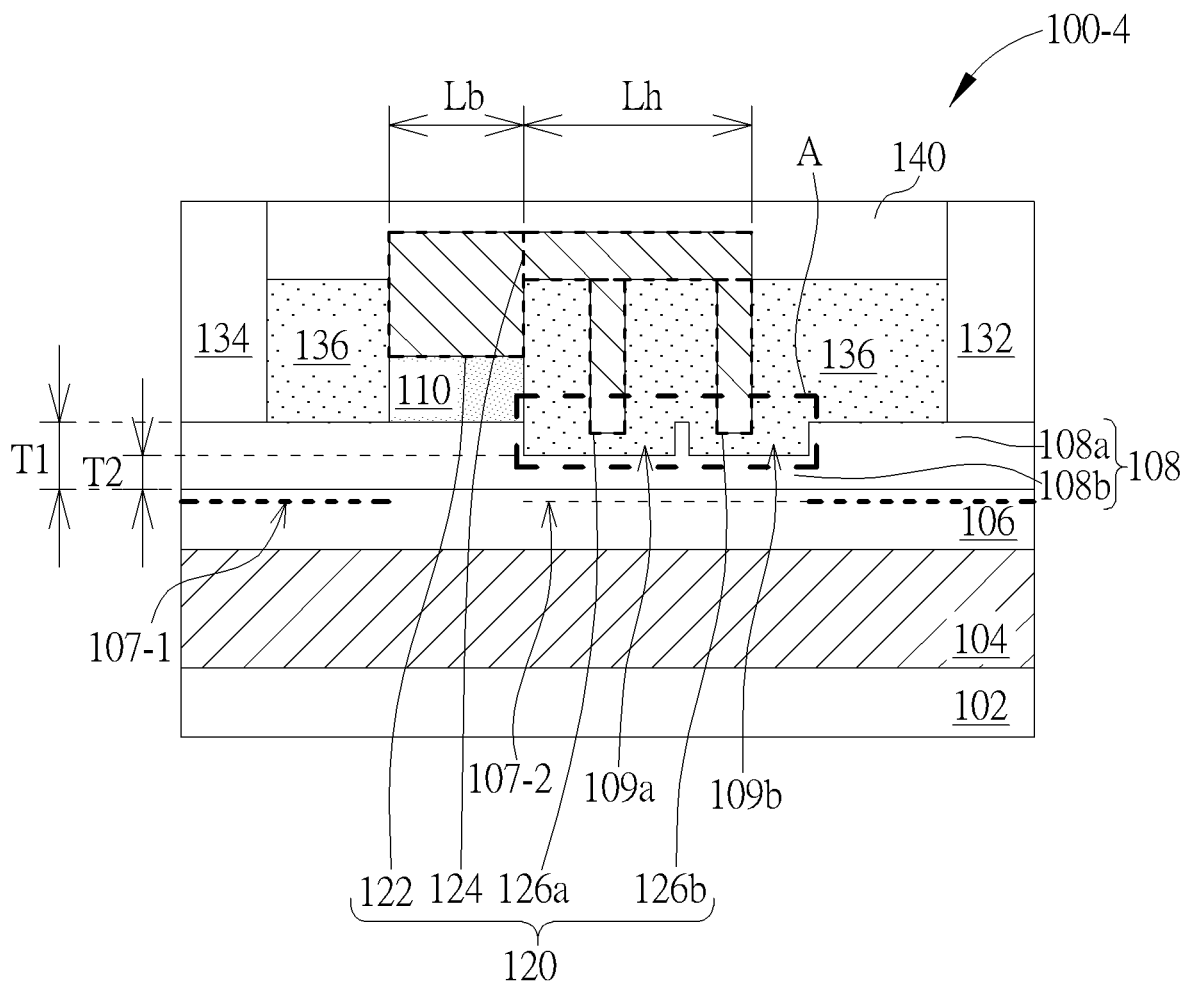
FIG. 6 is a schematic cross-sectional view of a semiconductor device having a plurality of vertical extension portions according to a variant embodiment of the present invention.
Figure 6:
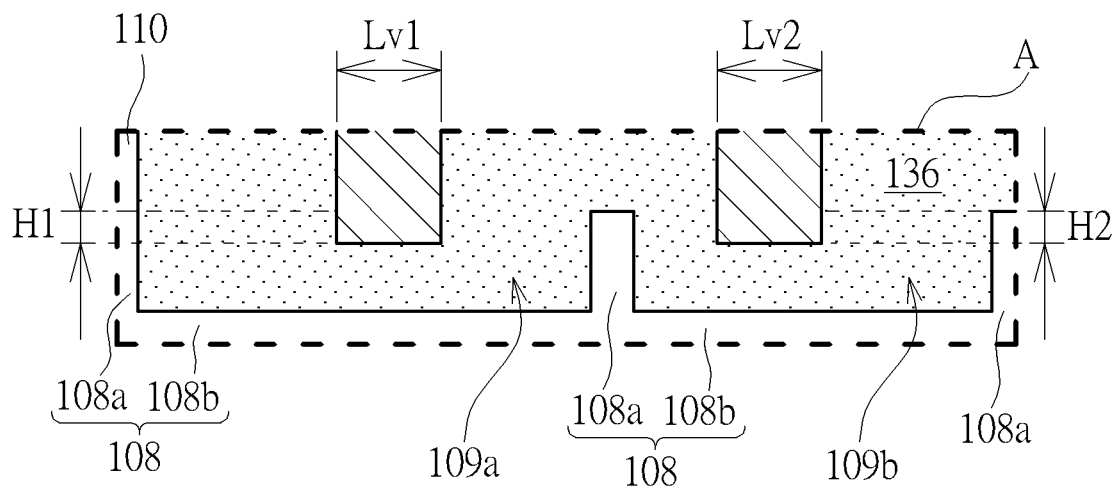

FIG. 6 is a schematic cross-sectional view of a semiconductor device having a plurality of vertical extension portions according to a variant embodiment of the present invention. As shown in FIG. 6, the structure of the semiconductor device 100-4 is similar to that of the semiconductor device 100-1 shown in the embodiment of FIG. 1, the main difference is that the gate electrode 120 of the semiconductor device 100-4 includes a plurality of vertical extension portions, such as a first vertical extension portion 126a and a second vertical extension portion 126b, and the semiconductor device 100-4 includes a plurality of recesses, such as a first recess 109a and a second recess 109b. The direction of the long axis (i.e., the direction perpendicular to the cross-section) of each recess may be parallel to each other.

Referring to an enlarged schematic diagram of a region A of FIG. 6, the bottom surface length Lv1 of the first vertical extension portion 126a and the bottom surface length Lv2 of the second vertical extension portion 126b may be smaller than the bottom surfaces of the first recess 109a and the second recess 109b, respectively. Therefore, the first vertical extension portion 126a may completely overlap the bottom surface of the first recess 109a, and the bottom surface of the second vertical extension portion 126b may completely overlap the bottom surface of the second recess 109b. The bottom surface of the first vertical extension portion 126a may be located in the first recess 109a, and the bottom surface of the second vertical extension portion 126b may be located in the second recess 109b, with overlapping heights H1 and H2, respectively. Overlapping heights H1, H2 are smaller than the thickness T1 of the first portion 108a of the semiconductor barrier layer 108.

Figure 7:
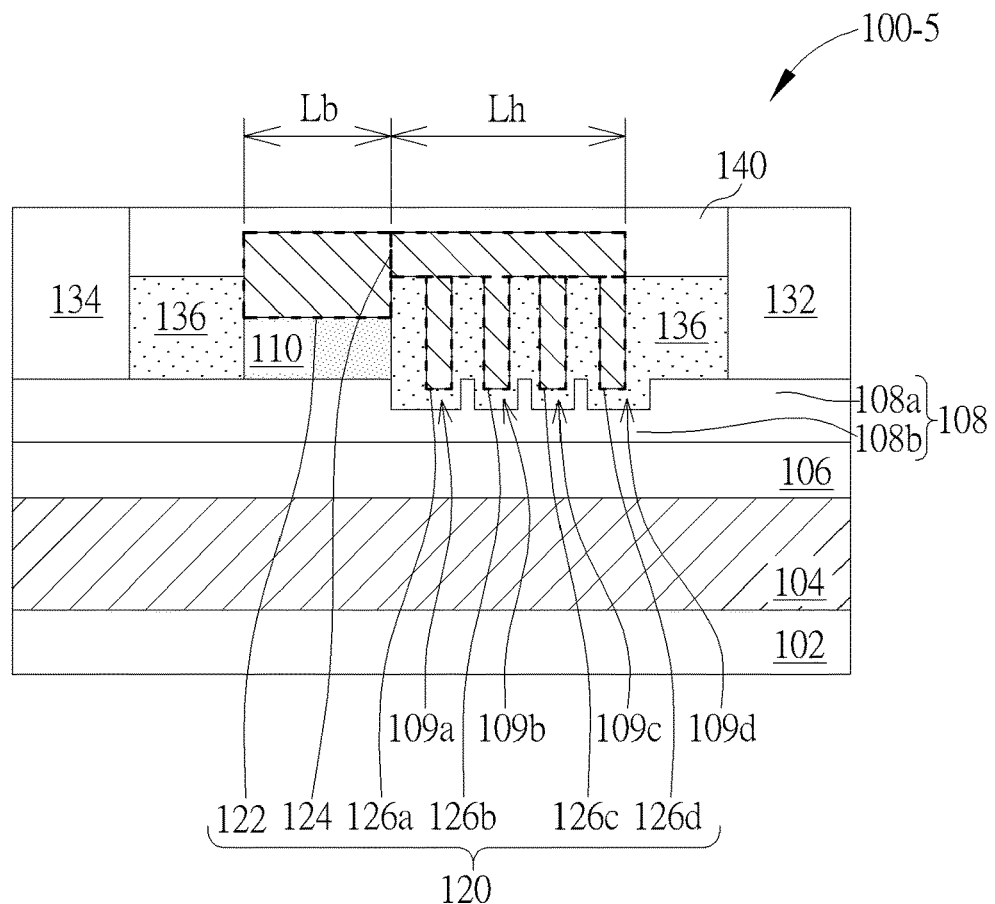
FIG. 7 is a schematic cross-sectional view of a semiconductor device having a plurality of vertical extension portions according to a variant embodiment of the present invention.

FIG. 7 is a schematic cross-sectional view of a semiconductor device having a plurality of vertical extension portions according to a variant embodiment of the present invention. As shown in FIG. 7, the structure of the semiconductor device 100-5 is similar to that of the semiconductor device 100-4 shown in the embodiment of FIG. 6, the main difference is that the gate electrode 120 of the semiconductor device 100-5 includes more than two vertical extension portions, such as a first vertical extension portion 126a, a second vertical extension portion 126b, a third vertical extension portion 126c, and a fourth vertical extension portion 126d. The semiconductor device 100-5 includes more than two recesses, such as a first recess 109a, a second recess 109b, a third recess 109c, and a fourth recess 109d. According to one embodiment of the present invention, the first recess 109a, the second recess 109b, the third recess 109c, and the fourth recess 109d may be separated from each other and parallel to each other, so that its top-view arrangement may be as shown in FIG. 8.

Figure 8:
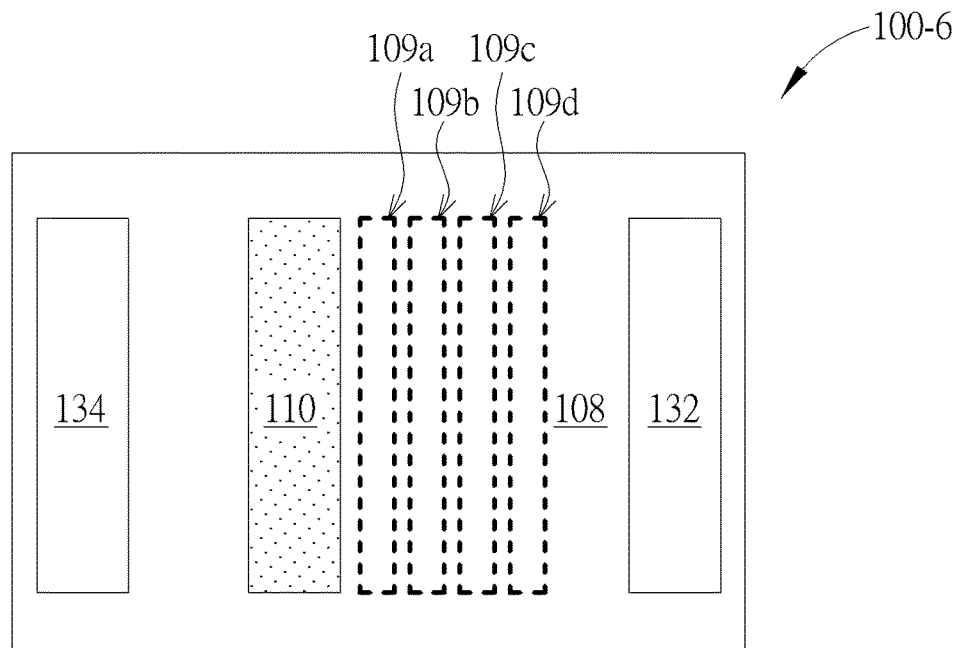
FIG. 8 is a schematic top view of a semiconductor device according to one embodiment of the present invention.

FIG. 8 is a schematic top view of a semiconductor device according to one embodiment of the present invention. With reference to FIG. 8, the first recess 109a, the second recess 109b, the third recess 109c, and the fourth recess 109d in the semiconductor device 100-5 may be disposed at one side of the gate capping layer 110, and the contour of each recess 109a-109d may be a rectangle. The long axis of each recess 109a-109d may be parallel to the long axis of the gate capping layer 110, but is not limited thereto. According to one embodiment of the present invention, each recess 109a-109d is not limited to a rectangle, but may have other geometric shapes. For example, in a case where the gate capping layer 110 is arc-shaped or ring-shaped when viewed from a top-down perspective, the contour of each recess 109a-109d disposed along the side of the gate capping layer 110 may be arc-shaped or ring-shaped when viewed from a top-down perspective, but is not limited to this.

Figure 9:
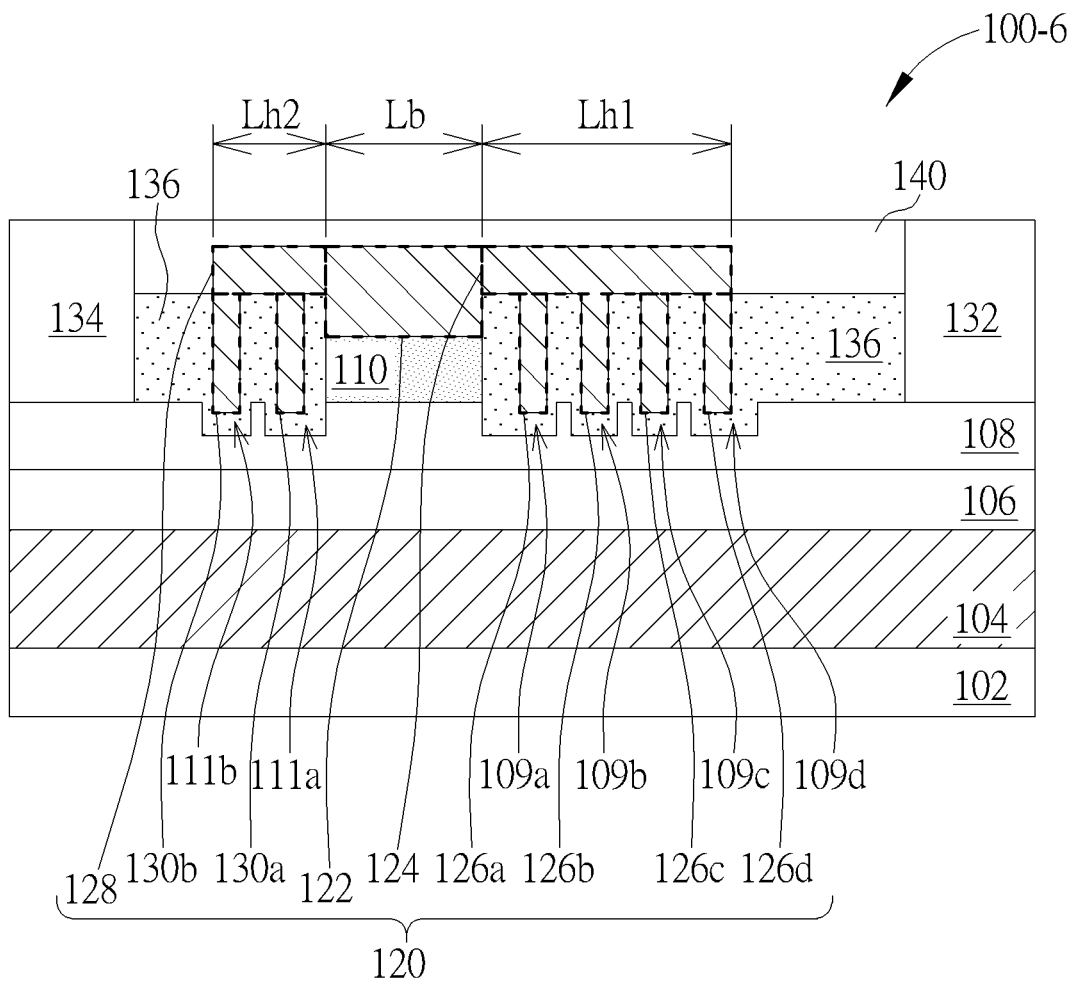
FIG. 9 is a schematic cross-sectional view of a semiconductor device having a plurality of vertical extension portions according to a variant embodiment of the present invention.

FIG. 9 is a schematic cross-sectional view of a semiconductor device having a plurality of vertical extension portions according to a variant embodiment of the present invention. As shown in FIG. 9, the structure of the semiconductor device 100-6 is similar to that of the semiconductor device 100-5 shown in the embodiment of FIG. 7, the main difference is that the vertical extension portion of the gate electrode 120 of the semiconductor device 100-6 is located not only at the side close to the drain electrode 132 but also at the side close to the source electrode 134. For example, the gate electrode 120 of the semiconductor device 100-6 may further include a fifth vertical extension portion 130a and a sixth vertical extension portion 130b, and further include a fifth recess 111a and a sixth recess 111b.

Figure 10:
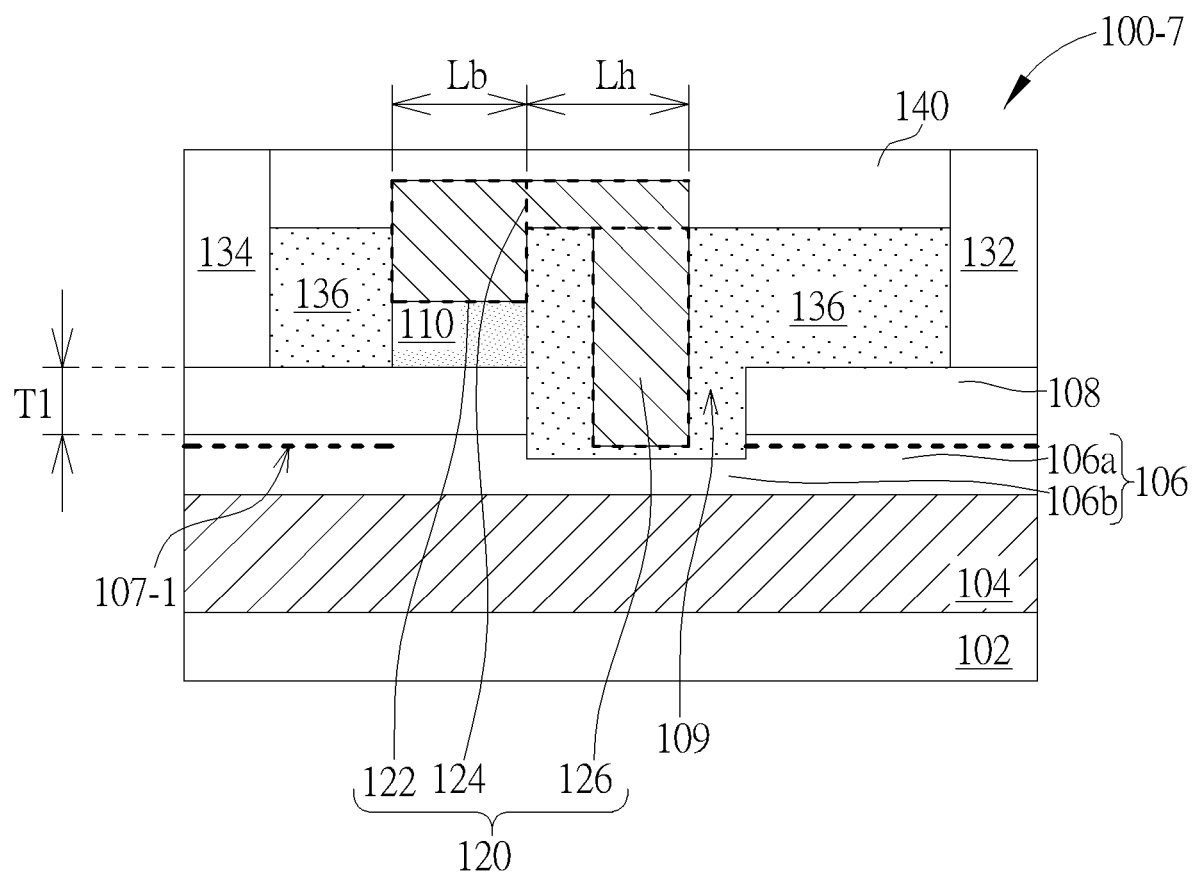
FIG. 10 is a schematic cross-sectional view of a semiconductor device according to a variant embodiment of the present invention.

FIG. 10 is a schematic cross-sectional view of a semiconductor device according to a variant embodiment of the present invention. As shown in FIG. 10, the structure of the semiconductor device 100-7 is similar to that of the semiconductor device 100-1 shown in the embodiment of FIG. 1. The main difference is that the recess 109 of the semiconductor device 100-7 penetrates through the semiconductor barrier layer 108, and the bottom surface of the recess 109 exposes the semiconductor channel layer 106, or even the bottom surface of the recess 109 may be located in the semiconductor channel layer 106, so that the semiconductor channel layer 106 can have a relatively thick first portion 106a and relatively thin second portion 106b. In addition, the bottom surface of the vertical extension portion 126 may penetrate into the recess 109, but does not directly contact the semiconductor channel layer 106. According to one embodiment of the present invention, the number, length, width, depth and orientation of the recesses 109 of the semiconductor device 100-7 may be adjusted according to actual requirements, so that the top-views of the arrangement of the recesses may be similar to the arrangement shown in FIGS. 2, 3 and 8, respectively, but not limited thereto.

According to the embodiments of the present invention, the depth of each recess 109 of the semiconductor devices 100-1, 100-2, 100-3, 100-4, 100-5 and 100-6 may also be adjusted accordingly, so that all or some of the recesses 109 may penetrate through the semiconductor barrier layer 108. Thus, the bottom surfaces of the recesses 109 may exposes, or even be located in, the semiconductor channel layer 106 so that the semiconductor channel layer 106 can have a relatively thick first portion and relatively thin second portion. In addition, the bottom surface of the vertical extension portion 126 may be down to each recess 109, but does not directly contact the semiconductor channel layer 106.

The electrical performance of the semiconductor device according to the embodiments of the present invention is further disclosed in the following paragraphs. For the semiconductor devices 100-1, 100-2, 100-3, 100-4, 100-5 and 100-6 according to the above embodiments, the semiconductor barrier layer 108 has a relatively thick first portion 108a and at least one relatively thin second portion 108b, and the vertical extension portions 126, 126a-126d and 130a-130b of the gate electrode 120 may be disposed directly above the second portion 108b. For the semiconductor device 100-7 disclosed in the above embodiment, the semiconductor barrier layer 108 is penetrated by the recess 109, where the vertical extension portions 126, 126a-126d and 130a-130b may be regarded as field plates for controlling or adjusting the electric field distribution in the semiconductor barrier layer 108 and/or in the semiconductor channel layer 106. By providing at least one recess 109 and at least one vertical extension portion 126, not only the on-resistance ($R_{ON}$) of the semiconductor devices 100-1, 100-2, 100-3, 100-4, 100-5, 100-6 and 100-7 may be reduced, but also the transfer conductance (gm) and breakdown voltage ($V_{BR}$) may be improved. Therefore, the electrical performance of the semiconductor devices 100-1, 100-2, 100-3, 100-4, 100-5, 100-6, and 100-7 is improved accordingly.

Figure 11:
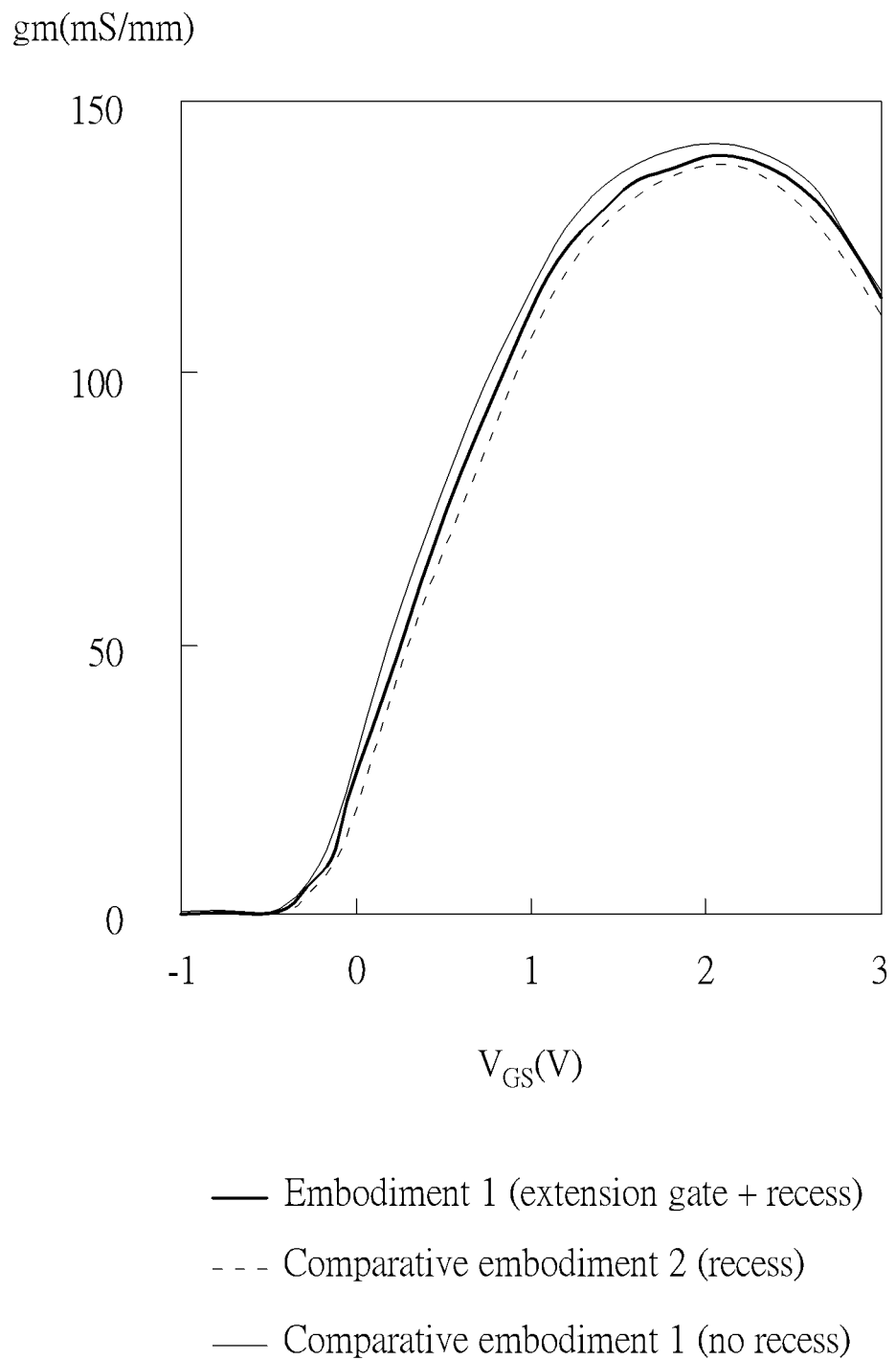
FIG. 11 is a diagram showing the electrical performance of the transfer conductance (gm) of the semiconductor devices according to embodiments and comparative embodiments of the present invention.

FIG. 11 shows transfer conductance (gm) of semiconductor devices according to embodiments and comparative embodiments of the present invention. Comparative embodiment 1 corresponds to a conventional semiconductor device, in which a semiconductor barrier layer does not include a recess, and the gate electrode does not include any horizontal extension portions or any vertical extension portions. Comparative embodiment 2 corresponds to another conventional semiconductor device, in which a semiconductor barrier layer includes a recess, but the gate electrode does not include any horizontal extension portions or vertical extension portions. Embodiment 1 corresponds to the semiconductor device 100-1 of FIG. 1. Referring to FIG. 11, during the process of gradually increasing the gate voltage ($V_{GS}$) of the semiconductor devices, while the bias applied between the source electrode and the drain electrode is fixed ($V_{DS}$=10V), the transfer conductance of the semiconductor device according to Embodiment 1 at each gate voltage ($V_{GS}$) may have a value close to the transfer conductance of the semiconductor device according to Comparative embodiment 1 and greater than the transfer conductance of the semiconductor device according to Comparative embodiment 2.

Figure 12:
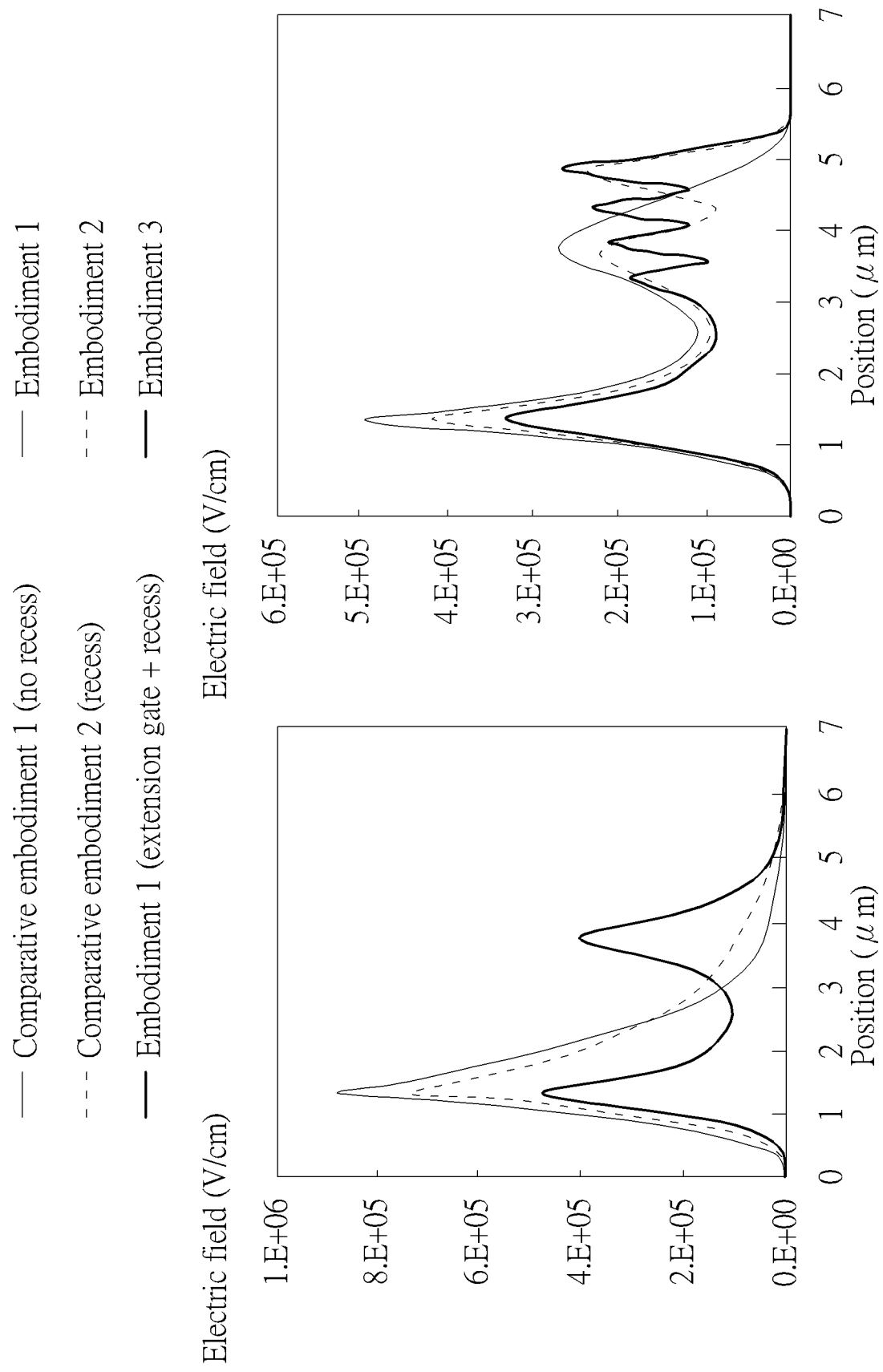
FIG. 12 is a diagram showing the relationship between electric field and position in semiconductor devices according to embodiments and comparative embodiments of the present invention.

FIG. 12 is a diagram showing the relationship between the electric field and the position in the semiconductor devices according to embodiments and comparative embodiments of the present invention. The structures of the semiconductor devices of Comparative embodiment 1, Comparative embodiment 2 and Embodiment 1 are similar to those shown in FIG. 11; Embodiment 2 corresponds to the semiconductor device 100-4 of FIG. 6; Embodiment 3 corresponds to the semiconductor device 100-5 of FIG. 7. The term "position" shown near the horizontal axis of FIG. 12 refers to the horizontal position, where the position "0" roughly corresponds to the boundary between the gate capping layer and the recess of the semiconductor device. The larger the value of the position, the closer it is to the drain electrode. Referring to the figure on the left-hand side of FIG. 12, for the semiconductor devices of Comparative embodiment 1 and Comparative embodiment 2, the electric field distribution shows single peak between 7E5 and 9E5 V/cm, which is close to the gate electrode. Thus, the electric field distribution is not uniform. In contrast, in the semiconductor device 100-1 of Embodiment 1, the electric field distribution shows two peaks with peak values less than 5E5 V/cm. Thus, the electric field may be uniformly distributed between the gate electrode and the drain electrode. Therefore, the semiconductor device of Embodiment 1 may effectively change the electric field distribution and reduce the peak value of the electric field, so that the phenomenon of impact ionization the semiconductor device is less likely to happen. Referring to the figure on the right-hand side of FIG. 12, for the semiconductor device 100-4 of Embodiment 2, the electric field distribution shows three peaks with peak values all less than 5.5E5 V/cm. In addition, for the semiconductor device 100-5 of Embodiment 3, the electric field distribution shows 5 peaks with peak values all less than 3.5E5 V/cm. Therefore, compared with Embodiment 1, the semiconductor device 100-5 of Embodiment 3 may further adjust the electric field distribution and reduce the peak value of electric field, so that the semiconductor device is less likely to generate impact ionization.

Figure 13:
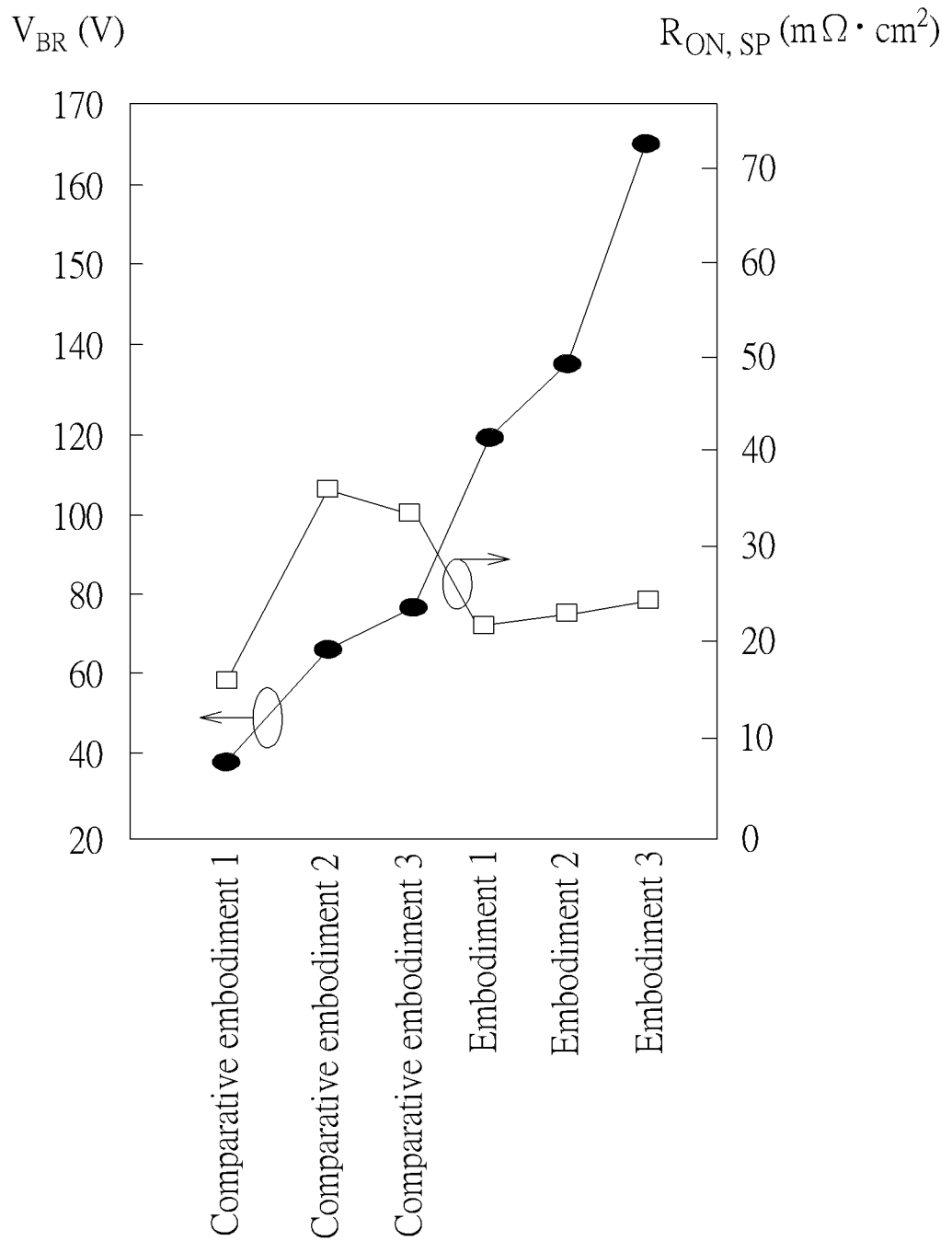
FIG. 13 is a diagram showing breakdown voltage ($V_{BR}$) and specific on-resistance ($R_{ON,SP}$) of semiconductor devices according to embodiments and comparative embodiments of the present invention.

FIG. 13 is a breakdown voltage ($V_{BR}$) and specific on-resistance ($R_{ON,SP}$) of semiconductor devices according to embodiments and comparative embodiments of the present invention. The structures of the semiconductor devices of Comparative embodiment 1, Comparative embodiment 2, Embodiment 1 and Embodiment 2 are similar to those shown in FIG. 11 and FIG. 12. Comparative embodiment 3 corresponds to a conventional semiconductor device, in which a semiconductor barrier layer includes a recess and the gate electrode includes a horizontal extension portion, but the gate electrode does not include a vertical extension portion. Embodiment 3 corresponds to the semiconductor device 100-5 of FIG. 7. Referring to FIG. 13, regarding breakdown voltages, the breakdown voltages that Embodiments 1 to 3 may withstand are all greater than those of Comparative embodiments 1 to 3, and Embodiment 3 may withstand the highest breakdown voltage (about 165V). For specific on-resistance, the specific on-resistance of Embodiments 1 to 3 is about 20 mΩ·cm² to 25 mΩ·cm², which is larger than the specific on-resistance of Comparative embodiment 1 but still smaller than that of Comparative embodiment 2 and Comparative embodiment 3.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
  a substrate;
  a semiconductor channel layer disposed on the substrate;
  a semiconductor barrier layer disposed on the semiconductor channel layer, wherein a surface of the semiconductor barrier layer comprises at least one recess;
  a first interlayer dielectric layer disposed on the semiconductor barrier layer, wherein the first interlayer dielectric layer has a single layer structure;
  a gate electrode disposed on the first interlayer dielectric layer, wherein the gate electrode comprises a body portion and at least one vertical extension portion respectively extending into the first interlayer dielectric layer, wherein the at least one vertical extension portion overlaps the at least one recess, and a portion of the first interlayer dielectric layer is between a bottom surface of the at least one vertical extension portion and a bottom surface of the at least one recess in a vertical direction with respect to a top surface of the semiconductor barrier layer;
  a gate capping layer disposed between the semiconductor barrier layer and the body portion of the gate electrode; and
  a second interlayer dielectric layer disposed on the first interlayer dielectric layer and directly covering the gate electrode and the first interlayer dielectric layer, wherein a top surface of the first interlayer dielectric layer between the body portion and the at least one vertical extension portion is flush with another top surface of the first interlayer dielectric layer that is in direct contact with the second interlayer dielectric layer,
  wherein the at least one recess comprises a plurality of recesses separated from each other, portions of the recesses are disposed at one side of the body portion of the gate electrode, and other portions of the recesses are disposed at another side of the body portion of the gate electrode.

2. The semiconductor device of claim 1, wherein the gate capping layer adjoins the at least one recess.

3. The semiconductor device of claim 1, wherein the body portion of the gate electrode does not overlap the at least one recess.

4. The semiconductor device of claim 1, wherein a bottom surface of the at least one recess is separated from the semiconductor channel layer.

5. The semiconductor device according to claim 1, wherein the gate electrode further comprises a horizontal extension portion electrically coupling the body portion to the at least one vertical extension portion.

6. The semiconductor device of claim 5, wherein a bottom surface of the at least one vertical extension portion is lower than a bottom surface of the horizontal extension portion.

7. The semiconductor device of claim 1, wherein the bottom surface of the at least one vertical extension portion completely overlaps a bottom surface of the at least one recess.

8. The semiconductor device of claim 1, wherein a bottom surface of the at least one vertical extension portion is lower than a bottom surface of the body portion of the gate electrode.

9. The semiconductor device of claim 1, wherein a bottom surface of the at least one vertical extension portion is in the at least one recess.

10. The semiconductor device according to claim 1, wherein the at least one vertical extension portion comprises a first vertical extension portion and a second vertical extension portion separated from each other, and the at least one recess comprises a first recess and a second recess separated from each other.

11. The semiconductor device of claim 10, wherein a bottom surface of the first vertical extension portion is in the first recess, and a bottom surface of the second vertical extension portion is in the second recess.

12. The semiconductor device according to claim 10, wherein in a plan view, a long axis of the first recess is parallel to a long axis of the second recess.

13. The semiconductor device according to claim 1, wherein a gate dielectric layer is disposed between the body portion of the gate electrode and the semiconductor barrier layer.

14. The semiconductor device of claim 1, wherein the body portion of the gate electrode directly contacts the semiconductor barrier layer.

* * * * *